United States Patent
Ando et al.

(10) Patent No.: US 10,727,402 B2
(45) Date of Patent: Jul. 28, 2020

(54) METHOD FOR PRODUCING TUNNEL MAGNETORESISTIVE ELEMENT

(71) Applicants: TOHOKU UNIVERSITY, Sendai-shi, Miyagi (JP); KONICA MINOLTA, INC., Chiyoda-ku, Tokyo (JP)

(72) Inventors: Yasuo Ando, Sendai (JP); Mikihiko Oogane, Sendai (JP); Kosuke Fujiwara, Sendai (JP); Koujirou Sekine, Ibaraki (JP); Junichi Jono, Tokyo (JP); Masaaki Tsuchida, Hachioji (JP)

(73) Assignees: TOHOKU UNIVERSITY, Miyagi (JP); KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 16/478,492

(22) PCT Filed: Jan. 17, 2018

(86) PCT No.: PCT/JP2018/001085
§ 371 (c)(1),
(2) Date: Jul. 17, 2019

(87) PCT Pub. No.: WO2018/139276
PCT Pub. Date: Aug. 2, 2018

(65) Prior Publication Data
US 2019/0393411 A1    Dec. 26, 2019

(30) Foreign Application Priority Data
Jan. 24, 2017  (JP) ................... 2017-010215

(51) Int. Cl.
| | |
|---|---|
| *H01L 43/12* | (2006.01) |
| *H01F 41/22* | (2006.01) |
| *H01L 43/08* | (2006.01) |
| *H01L 43/10* | (2006.01) |
| *G01R 33/09* | (2006.01) |
| *H01F 10/16* | (2006.01) |

(52) U.S. Cl.
CPC ............ *H01L 43/12* (2013.01); *H01F 41/22* (2013.01); *H01L 43/08* (2013.01); *G01R 33/09* (2013.01); *H01F 10/16* (2013.01); *H01L 43/10* (2013.01)

(58) Field of Classification Search
None
See application file for complete search history.

(56) References Cited

U.S. PATENT DOCUMENTS

2011/0130850 A1 * 6/2011 Zheng ................. G05B 13/048
                                                                  700/31
2016/0308112 A1 * 10/2016 Tan .................... H01J 37/32651
(Continued)

FOREIGN PATENT DOCUMENTS

| JP | 09025168 | 1/1997 |
| JP | 2001068759 A | 3/2001 |

(Continued)

OTHER PUBLICATIONS

International Search Report (ISR) dated Apr. 10, 2018 issued in International Application No. PCT/JP2018/001085.
(Continued)

*Primary Examiner* — Raj R Gupta
(74) *Attorney, Agent, or Firm* — Holtz, Holtz & Volek PC

(57) ABSTRACT

A method for producing a tunnel magnetoresistive element includes a stacking step, then in-magnetic field heating, and then dry etching. The stacking includes stacking a B absorption layer which is in contact with an upper surface of a CoFeB layer. The dry etching includes removal of layers to the B absorption layer. An end of etching is set as an end point time detected by an analysis device when a final layer before the B absorption layer directly above the CoFeB layer is exposed has reduced to a prescribed level, or when the B absorption layer directly above the CoFeB layer has increased to the prescribed level. An amount of over-etching (Continued)

after the end point time is specified in advance, and the B absorption layer is stacked such that the thickness from the prescribed level to the upper surface of the CoFeB layer corresponds to the over-etching amount.

5 Claims, 7 Drawing Sheets

(56) References Cited

U.S. PATENT DOCUMENTS

2016/0380187 A1* 12/2016 Seino .................. G11C 11/161
                                                                  257/421
2017/0317274 A1* 11/2017 Seino .................. H01L 43/08

FOREIGN PATENT DOCUMENTS

| JP | 2004128026 A | 4/2004 |
| JP | 2008085208 A | 4/2008 |
| JP | 2012221549 A | 11/2012 |
| JP | 2013048124 A | 3/2013 |
| JP | 2013105825 A | 5/2013 |
| JP | 5816867 B2 | 10/2015 |

OTHER PUBLICATIONS

Written Opinion dated Apr. 10, 2018 issued in International Application No. PCT/JP2018/001085.
International Preliminary Report on Patentability (IPRP) and Written Opinion dated Jul. 30, 2019 issued in International Application No. PCT/JP2018/001085.

* cited by examiner

FIG.2

| | | Comparative example 1 | Comparative example 2 | Present invention 1 | Present invention 2 | Present invention 3 |
|---|---|---|---|---|---|---|
| 1 | Before heating in magnetic field | 61 Ru<br>51 Ta<br>CoFeB<br>20 MgO<br>14 CoFeB<br>13 Ru<br>12 CoFe<br>11 IrMn<br>3 Ta<br>2 Si,SiO₂ | Ru<br>Ta<br>CoFeB<br>MgO<br>CoFeB<br>Ru<br>CoFe<br>IrMn<br>Ta<br>Si,SiO₂ | Ru<br>Ta<br>CoFeB<br>MgO<br>CoFeB<br>Ru<br>CoFe<br>IrMn<br>Ta<br>Si,SiO₂ | Ru<br>Ni (52)<br>Ta<br>CoFeB<br>MgO<br>CoFeB<br>Ru<br>CoFe<br>IrMn<br>Ta<br>Si,SiO₂ | Ru<br>MgO (53)<br>Ta<br>CoFeB<br>MgO<br>CoFeB<br>Ru<br>CoFe<br>IrMn<br>Ta<br>Si,SiO₂ |
| 2 | After deposition of soft magnetic layer | 33 NiFe/CoFeSiB<br>Ta<br>31 CoFeB<br>MgO<br>CoFeB<br>Ru<br>CoFe<br>IrMn<br>Ta<br>Si,SiO₂ | NiFe/CoFeSiB<br>CoFeB<br>MgO<br>CoFeB<br>Ru<br>CoFe<br>IrMn<br>Ta<br>Si,SiO₂ | NiFe/CoFeSiB<br>CoFeB<br>MgO<br>CoFeB<br>Ru<br>CoFe<br>IrMn<br>Ta<br>Si,SiO₂ | NiFe/CoFeSiB<br>CoFeB<br>MgO<br>CoFeB<br>Ru<br>CoFe<br>IrMn<br>Ta<br>Si,SiO₂ | NiFe/CoFeSiB<br>CoFeB<br>MgO<br>CoFeB<br>Ru<br>CoFe<br>IrMn<br>Ta<br>Si,SiO₂ |
| 3 | | Ru 3nm<br>Ta 5nm | Ru 3nm<br>Ta 5nm | Ru 3nm<br>Ta 1nm | Ru 3nm<br>Ni 4nm<br>Ta 1nm | Ru 3nm<br>MgO 4nm<br>Ta 1nm |
| 4 | Etching for exposing upper CoFeB layer | △ Ta layer remaining | △ CoFeB layer overshaved | ○ | ○ | ○ |
| 5 | TMR ratio | ◎ | × | ○ | ◎ | ◎ |
| 6 | Magnetic coupling between upper CoFeB layer and soft magnetic layer | × | ○ | ○ | ○ | ○ |
| 7 | Optical detection signal | (graph) | (graph) | (graph) | (graph) | (graph) |

—— Ru  ········ Ta  ------ CoFeB  – – – Ni  —·— MgO

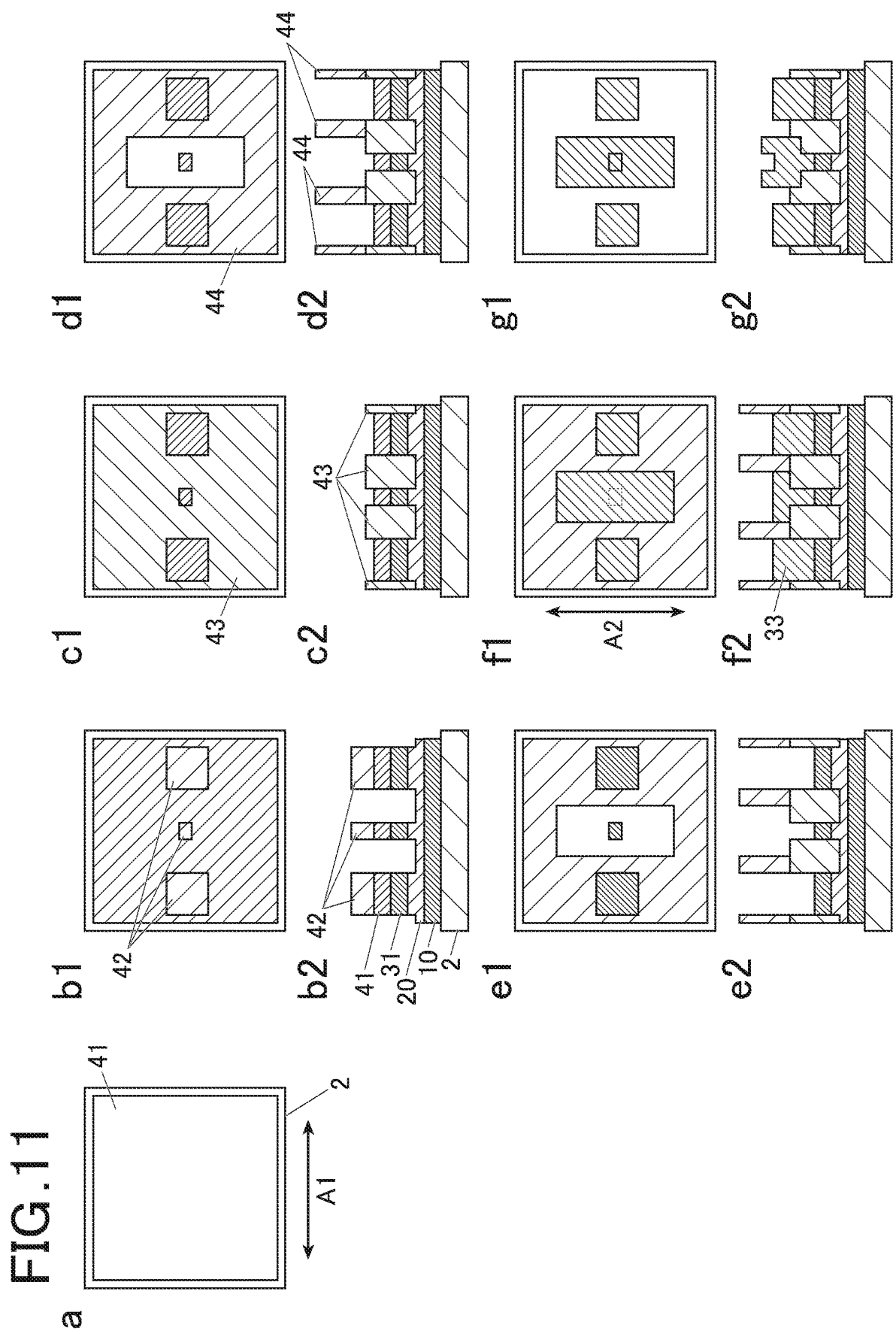

METHOD FOR PRODUCING TUNNEL MAGNETORESISTIVE ELEMENT

TECHNICAL FIELD

The present invention relates to a method for producing a tunnel magnetoresistive element.

BACKGROUND ART

A tunnel magnetoresistive element (TMR) includes a pinned magnetic layer in which a magnetization direction is pinned (fixed), a free magnetic layer in which a magnetization direction changes depending on an external magnetic field, and an insulating layer between the pinned magnetic layer and the free magnetic layer, and forms a magnetic tunnel junction (MTJ). The resistance of the insulating layer changes by the tunnel effect depending on the angle between the magnetization direction of the pinned magnetic layer and the magnetization direction of the free magnetic layer. Such a tunnel magnetoresistive element is used in a magnetic memory, a magnetic head, a magnetic sensor, and the like.

In a magnetic sensor based on the principle of the TMR, a huge TMR ratio can be realized by magnetic annealing of the stack structure of the MTJ portion (CoFeB/MgO/CoFeB). At this time, it is important that B absorption layers (Ti, MgO, and the like) with a sufficient thickness made of a material that absorbs the diffusing B from the CoFeB layers are adjacent to the portion.

According to the invention disclosed in Patent Document 1, an MgO layer is positioned outside the MTJ in the MRAM.

According to the invention disclosed in Patent Document 2, a Ti layer is positioned in contact with a CoFeB layer(s) in a magnetic head or a memory.

CITATION LIST

Patent Literature

[Patent Document 1] Japanese Patent No 5816867
[Patent Document 2] Japanese Patent Application Laid-Open Publication No. 2008-85208
[Patent Document 3] Japanese Patent Application Laid-Open Publication No. h09-25168
[Patent Document 4] Japanese Patent Application Laid-Open Publication No. 2001-68759
[Patent Document 5] Japanese Patent Application Laid-Open Publication No. 2004-128026
[Patent Document 6] Japanese Patent Application Laid-Open Publication No. 2012-221549
[Patent Document 7] Japanese Patent Application Laid-Open Publication No. 2013-48124
[Patent Document 8] Japanese Patent Application Laid-Open Publication No. 2013-105825

SUMMARY OF INVENTION

Technical Problem

As described above, for realizing a huge TMR ratio by magnetic annealing of the stack structure of the MTJ portion (CoFeB/MgO/CoFeB) in a magnetic sensor based on the principle of the TMR, it is important that the B absorption layers (Ti, MgO, and the like) with a sufficient thickness are adjacent to the CoFeB layers.

Furthermore, in order that a TMR element exhibits a function as a magnetic sensor after the magnetic annealing, it is necessary to form a free magnetic layer by combining a soft magnetic material with the CoFeB layer on the opposite side of the CoFeB layer which operates as a pinned magnetic layer.

However, the huge TMR ratio cannot be realized if the material which sufficiently absorbs the diffusing B is left between the CoFeB layer and the soft magnetic layer.

According to the invention disclosed in Patent Document 1, a conductive oxide is deposited on a recording layer and a pinned layer each on the side opposite to the tunnel barrier. However, since the invention relates not to a sensor but to a memory, the deposited conductive oxide is not removed from either the pinned magnetic side or the free magnetic side. Thus, Patent Document 1 does not disclose a technique for removing the B absorption layer with high accuracy.

According to the invention disclosed in Patent Document 2, for realizing the huge TMR ratio of CoFeB/MgO/CoFeB, a Ti layer which easily absorbs B is positioned adjacently. However, since the invention relates not to a sensor but to a head or memory, the CoFeB layers are used as free magnetic layers as they are. The resulting large anisotropic magnetic field reduces the sensitivity when used as a sensor. Thus, Patent Document 2 does not disclose a technique for removing the B absorption layer with high accuracy.

The present invention has been made in view of the above problems of the conventional technique. An object of the present invention is to remove the B absorption layer with high accuracy after achieving a desired TMR ratio by magnetic annealing of a B absorption layer having a sufficient thickness positioned adjacent to an upper CoFeB layer of the MTJ. Further objects of the present invention is to realize good exchange coupling between a CoFeB layer and a soft magnetic layer after accurate removal of the B absorption layer and to realize a tunnel magnetoresistive element that can be used for a magnetic sensor significantly high sensitivity.

Solution To Problem

In order to solve the above problems, the invention according to claim 1 provides a method for producing a tunnel magnetoresistive element in which a magnetic tunnel junction is formed with a pinned magnetic layer whose magnetization direction is fixed, a free magnetic layer whose magnetization direction changes depending on an external magnetic field, and an insulating layer disposed between the pinned magnetic layer and the free magnetic layer, and in which resistance of the insulating layer changes by a tunnel effect depending on an angle between the magnetization direction of the pinned magnetic layer and the magnetization direction of the free magnetic layer, the method including:

stacking including:
   stack of the pinned magnetic layer on a substrate, followed by stack of the insulating layer;
   stack of a CoFeB layer in contact with an upper surface of the insulating layer;
   stack of a directly contacting B absorption layer which is in contact with an upper surface of the CoFeB layer and includes a material which absorbs B; and
   stack of two or more layers on the CoFeB layer, the two or more layers including the directly contacting B absorption layer and including layers of different materials;
in-magnetic field heating including heating treatment of a stack after the stacking while applying an external magnetic field of a predetermined direction so that an easy magnetization axis of the CoFeB layer constituting a free magnetic layer is formed in a same direction as an easy magnetization axis of the pinned magnetic layer; and dry etching including removal of layers to the directly contacting B absorption layer from the stack after the in-magnetic field heating, wherein, in the dry etching, a dry etching apparatus and an analyzer which identifies a material at a surface etched by the dry etching apparatus are used, the dry etching apparatus ends etching at endpoint detection time when the analyzer detects that a last layer which appears before exposure of the directly contacting B absorption layer decreases to a predetermined level or that the directly contacting B absorption layer increases to a predetermined level, and wherein, in the stacking, the directly contacting B absorption layer is stacked such that a thickness from the predetermined level to the upper surface of the CoFeB layer corresponds to an over-etching amount by the dry etching apparatus after the endpoint detection time detected by the analyzer determined in advance.

The invention according to claim 2 provides the method for producing a tunnel magnetoresistive element according to claim 1, wherein the two or more layers on the CoFeB layer stacked in the stacking includes at least one B absorption layer and a cap layer for processing, the at least one B absorption layer including a material which absorbs B, and the cap layer for processing covering the at least one B absorption layer.

The invention according to claim 3 provides the method for producing a tunnel magnetoresistive element according to claim 2, wherein the at least one B absorption layer stacked in the stacking includes the directly contacting B absorption layer and includes layers of different materials.

The invention according to claim 4 provides the method for producing a tunnel magnetoresistive element according to claim 3, wherein, in the in-magnetic field heating, a desired TMR ratio is achieved through absorption of B from the CoFeB layer by the at least one B absorption layer.

The invention according to claim 5 provides the method for producing a tunnel magnetoresistive element according to any one of claims 1 to 4, further including depositing a soft magnetic layer on the CoFeB layer which is exposed in the dry etching.

Advantageous Effects Of Invention

According to the present invention, it is possible to remove the B absorption layer with high accuracy after achieving a desired TMR ratio by magnetic annealing of a B absorption layer having a sufficient thickness positioned adjacent to an upper CoFeB layer of the MTJ. Furthermore, it is possible to realize good exchange coupling between a CoFeB layer and a soft magnetic layer after accurate removal of the B absorption layer and to realize a tunnel magnetoresistive element that can be used for a magnetic sensor significantly high sensitivity.

BRIEF DESCRIPTION OF DRAWINGS

FIG. 2 shows conditions and results of inventive examples and comparative examples. Part 1 shows a stack structure before in-magnetic field heat treatment. Part 2 shows the stack structure after in-magnetic field heat treatment, dry etching, and soft magnetic layer deposition. Part 3 shows thickness of a layer on MTJ in Part 1. Part 4 shows evaluation of etching to an upper CoFeB layer of MTJ. Part 5 shows TMR ratio evaluation. Part 6 shows evaluation of magnetic coupling between an upper CoFeB layer of the MTJ and a soft magnetic layer. Part 7 shows time transition of detected light emission signal during etching.

FIG. 11 shows surface views and cross-Partal views of a stack structure showing a production process of a tunnel magnetoresistive element according to an example of the present invention.

DESCRIPTION OF EMBODIMENTS

Hereinafter, embodiments of the present invention are described with reference to the drawings. The following is an embodiment of the present invention and does not limit the present invention.
[Outline of Invention]
(Endpoint Detection)

First, detection of an endpoint of dry etching will be described with reference to FIG. 1.

In general, an optical or mass spectrometric endpoint detector may be attached to a dry etching apparatus. This endpoint detector is used as an analyzer in a dry etching step of the present production method.

Figure 1:
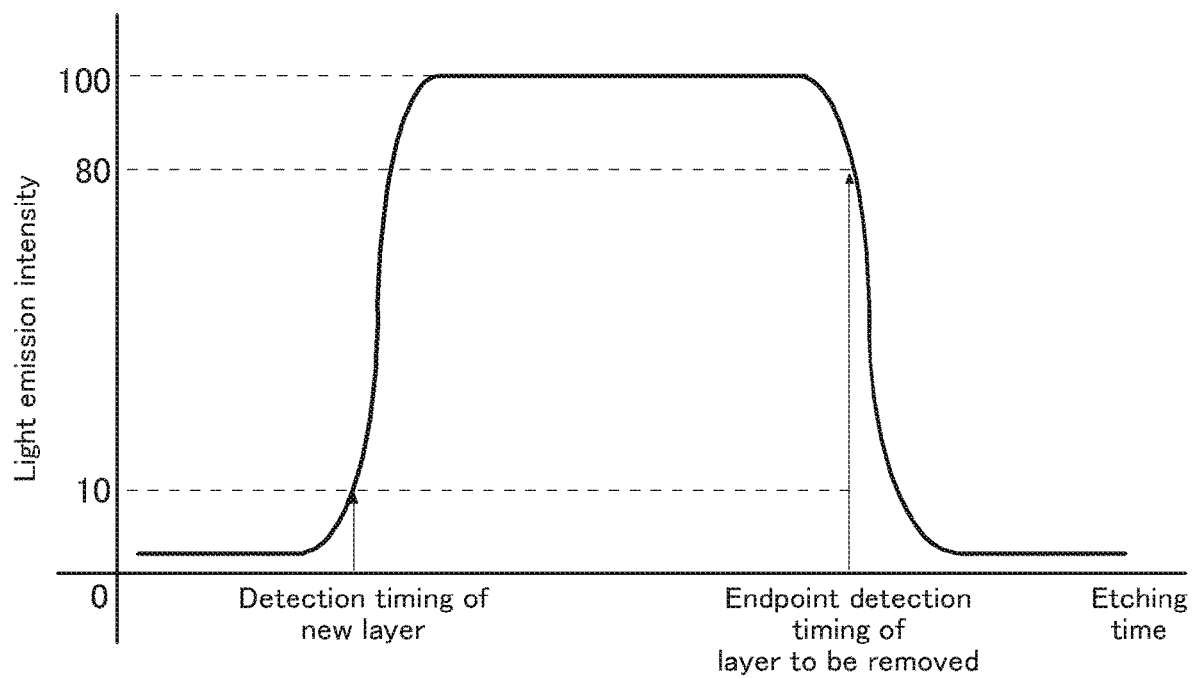
FIG. 1 shows a transition graph of light emission signal by optical analyzer as etching progresses.

An example of an optical detection algorithm is shown in FIG. 1. In the case of detecting a light emission signal of a layer to be removed, the time when the signal decreases to a predetermined level (80, for example, if the signal in the presence of the layer is 100) is defined to be the endpoint detection time. That is, the endpoint detection time is the time when the signal of the last layer which appears before a directly contacting B absorption layer is exposed is reduced to a predetermined level.

In the case of detecting a signal of a newly appearing layer when the layer to be removed changes, dry etching may be stopped when relative increase of the signal has reached to a predetermined level (10, for example, if the signal before starting the newly appearing layer removal is set to 0 and the maximum signal during the removal is set to 100 after starting the newly appearing layer removal). That is, the endpoint detection time may be the time when the detected amount of the directly contacting B absorption layer has increased to a predetermined level (for example, 10).

In the examples described below, the former is adopted.

Examples of Present Invention and Comparative Examples

Next, Inventive Examples and Comparative Examples will be described with reference to FIG. 2.

As shown in FIG. 2 ((Part 1), in a stacking step (common to Comparative Examples 1 and 2 and Inventive Examples 1 to 3), on a substrate (Si, $SiO_2$) 2 is formed an underlayer (Ta) 3; as a pinned magnetic layer 10 stacked thereon are an antiferromagnetic layer (IrMn) 11, a ferromagnetic layer (CoFe) 12, a magnetic coupling layer (Ru) 13, and a ferromagnetic layer (CoFeB) 14 from below; in contact with the upper surface of the ferromagnetic layer (CoFeB) 14 is further stacked an insulating layer (MgO) 20; and as a ferromagnetic layer constituting a free magnetic layer 30 is stacked a CoFeB layer 31 in contact with the upper surface of the insulating layer (MgO) 20.

Furthermore, as a directly contacting B absorption layer (common to Comparative Examples 1 and 2 and Inventive Examples 1 to 3) is stacked a Ta layer 51 which contacts the top surface of the CoFeB layer 31 and includes a material that absorbs B.

The material of the B absorption layer including the material that absorbs B may be Ta, Ni, Ti, MgO, and the like.

In Comparative Examples 1 and 2, the Ta layer 51 was 5 nm, and in Inventive Examples 1 to 3, the Ta layer 51 was 1 nm.

In Comparative Examples 1 and 2 and Inventive Example 1, a Ru layer 61 of 3 nm was further stacked as a cap layer for processing on the Ta layer 51.

In Inventive Example 2, a Ni layer 52 of 4 nm was stacked on the Ta layer 51, and the Ru layer 61 of 3 nm was stacked on the Ni layer 52 as the cap layer for processing.

In Inventive Example 3, an MgO layer 53 of 4 nm was stacked on the Ta layer 51, and the Ru layer 61 of 3 nm was stacked on the MgO layer 53 as the cap layer for processing.

In an in-magnetic field heating step, the above stack is heated during application of an external magnetic field of a predetermined direction, whereby an easy magnetization axis of the CoFeB layer 31 as the free magnetic layer is formed in the same direction as an easy magnetization axis of the pinned magnetic layer 10.

Next, in a dry etching step, layers of the stack after the in-magnetic field heating step are removed to the Ta layer 51 which is the directly contacting B absorption layer. The dry etching is performed by Ar ion milling FIG. 2 (Part 7) shows the detected optical signal.

In Comparative Example 1, etching was ended on the basis of the detection time when the detected signal of the Ru layer 61 has decreased to a predetermined level (for example, 80). As a result, about 1 nm of the Ta layer 51 was removed, but about 2 nm of the Ta layer 51 was left. Since the Ta layer 51 was sufficiently thick, the TMR ratio was well increased in the in-magnetic field heating step, however, magnetic coupling between the CoFeB layer 31 and the soft magnetic layer 33 was insufficient since the Ta layer 51 was left between the CoFeB layer 31 and the soft magnetic layer 33 even after the post process for depositing the soft magnetic layer as shown in FIG. 2 (Part 2).

In Comparative Example 2, etching was ended after a longer time than in Comparative Example 1, on the basis of the detection time when the detected signal of the Ru layer 61 has decreased to a predetermined level (for example, 80). As a result, the CoFeB layer 31 was shaved. Since there is a Ta layer 51 with a sufficient layer thickness, the TMR ratio was well increased in the in-magnetic field heating step, however, since the CoFeB layer 31 was shaved too much, the resulting TMR ratio could not be high. By the post process for depositing the soft magnetic layer, the CoFeB layer 31 and the soft magnetic layer 33 could be magnetically coupled with each other.

Therefore, an over-etching amount by the dry etching apparatus after the endpoint detection time, at which the analyzer detected reduction to a predetermined level (for example, 80), was determined in advance. It was determined to be 1 nm for a Ta layer in the case where the etching is finished immediately after the endpoint detection time as a trigger.

In Inventive Examples, stacking was performed on the basis of the reduction of the detected optical signal to the predetermined level (for example, 80), such that the thickness of a layer to the top of the CoFeB layer 31 corresponds to the over-etching amount, that is, the layer thickness of the Ta layer 51 as the directly contacting B absorption layer was 1 nm.

Therefore, in Inventive Example 1, the etching was ended at the detection time when the detected signal of the Ru layer 61, the last layer appearing before the directly contacting B absorption layer (Ta layer 51) was exposed, decreased to a predetermined level (for example, 80). The Ta layer 51 could be removed with high accuracy on the basis of the over-etching amount. That is, the Ta layer 51 could be completely removed, and the CoFeB layer 31 was not shaved.

In Inventive Example 1, the TMR ratio could be increased to a certain extent because there is a Ta layer 51 of 1 nm in the in-magnetic field heating step. By the post process for depositing the soft magnetic layer, the CoFeB layer 31 and the soft magnetic layer 33 could be magnetically coupled with each other.

Also in Inventive Example 2, etching was ended at the detection time when the detected signal of the Ni layer 52, the last layer appearing before the directly contacting B absorption layer (Ta layer 51) was exposed, decreased to a predetermined level (for example, 80). The Ta layer 51 could be removed with high accuracy on the basis of the over-etching amount. That is, the Ta layer 51 could be completely removed, and the CoFeB layer 31 was not shaved.

In Inventive Example 2, the TMR ratio could be increased well because there was a B absorption layer (Ta layer 51 and Ni layer 52) having a sufficient layer thickness in the in-magnetic field heating step. By the post process for depositing the soft magnetic layer, the CoFeB layer 31 and the soft magnetic layer 33 could be magnetically coupled with each other.

Also in Inventive Example 3, etching was ended at the detection time when the detected signal of the MgO layer 53, the last layer appearing before the directly contacting B absorption layer (Ta layer 51) was exposed, decreased to a predetermined level (for example, 80). The Ta layer 51 could be removed with high accuracy on the basis of the over-etching amount. That is, the Ta layer 51 could be completely removed, and the CoFeB layer 31 was not shaved.

In Inventive Example 3, the TMR ratio could be preferably increased because there is a B absorption layer (Ta layer 51 and MgO layer 53) having a sufficient layer thickness in the in-magnetic field heating step. By the post process for depositing the soft magnetic layer, the CoFeB layer 31 and the soft magnetic layer 33 could be magnetically coupled with each other.

As in Inventive Examples 2 and 3, the B absorption layer includes two or more layers including the directly contacting B absorption layer (Ta layer 51), and includes layers of different materials from each other. A B absorption layer of a sufficient thickness can be present adjacent to the CoFeB layer 31 in the in-magnetic field heating step while surely obtaining the detected signal indicating that only the layer corresponding to the over-etching amount is left. Therefore, it is possible to achieve a desired TMR ratio by absorbing B diffusing from the CoFeB layer using a B absorption layer including two layers (Ta layer 51+Ni layer 52 in Inventive Example 2, and Ta layer 51+MgO layer 53 in Inventive Example 3) in the in-magnetic field heating step, and in addition, to realize good exchange coupling between the CoFeB layer and the soft magnetic layer.

By using the tunnel magnetoresistive element produced by the method according to the present invention described above as a magnetic sensor, it is possible to provide a magnetic sensor with a remarkably high sensitivity.

[Related Matter, Example of Production]

Hereinafter, related matters and examples of production of the present invention will be described.

First, with reference to FIG. 3, basic structures of the tunnel magnetoresistive element and ideal magnetoresistive characteristics that the present invention intends to realize will be described.

Figure 3:
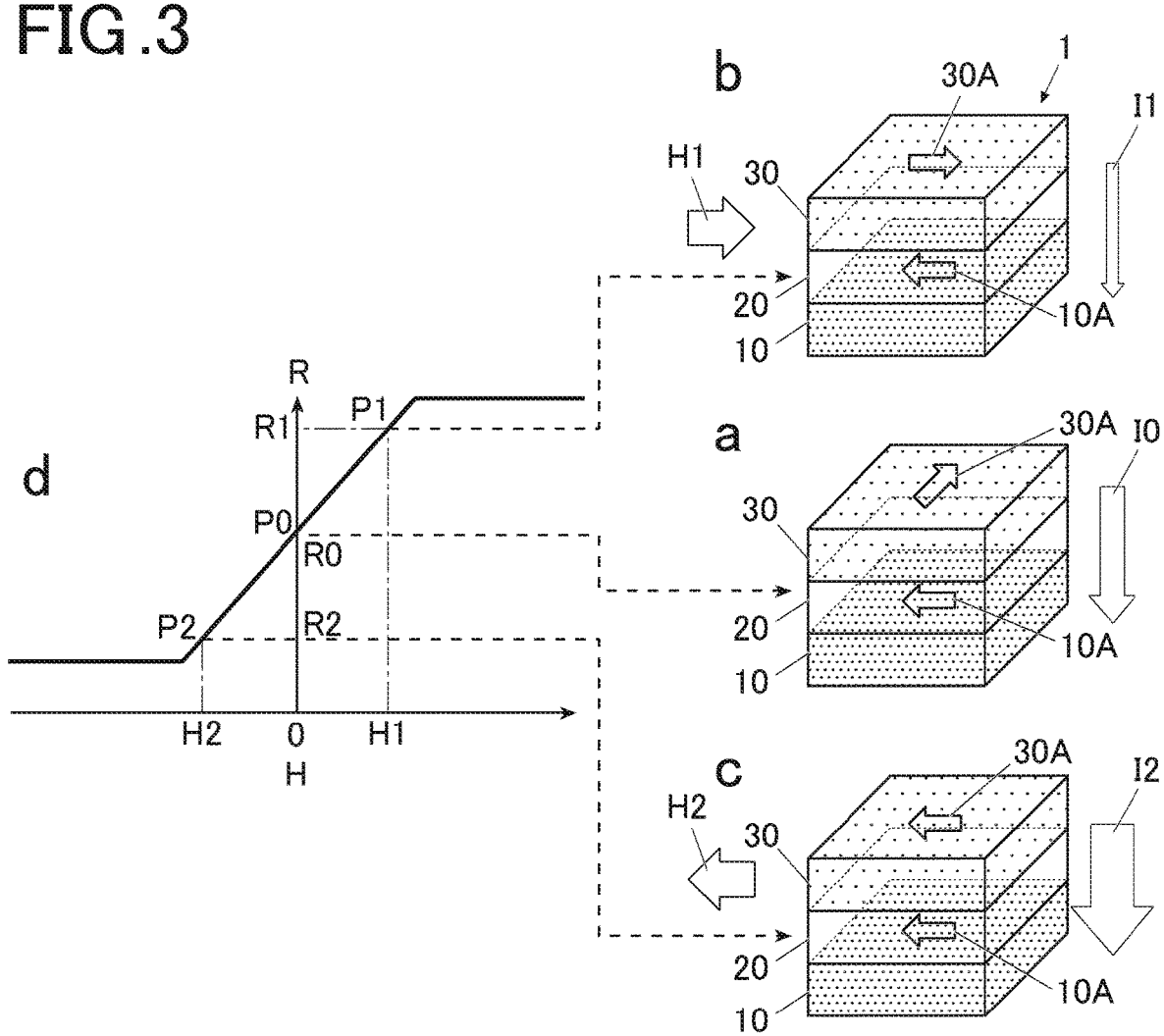
FIG. 3 shows a graph (Part d) showing ideal magnetoresistive characteristics to be realized by the present invention, and schematic views (Part a), (Part b) and (Part c) each showing a magnetization direction of a tunnel magnetoresistive element at each state on the graph.

As shown in FIG. 3, the tunnel magnetoresistive element 1 forms a magnetic tunnel junction by a pinned magnetic layer 10 in which the magnetization direction is pinned, a free magnetic layer 30 in which the magnetization direction changes depending on an external magnetic field, and an insulating layer 20 which is disposed between the pinned magnetic layer 10 and the free magnetic layer 30. The resistance of the insulating layer 20 changes due to the tunnel effect depending on the angle between the magnetization direction of the pinned magnetic layer 10 and the magnetization direction of the free magnetic layer 30.

FIG. 3 (Part a), (Part b), and (Part c) shows the magnetization direction 10A of the pinned magnetic layer 10 and the magnetization direction 30A of the free magnetic layer 30 in the respective magnetic fields shown in FIG. 3 (Part d).

FIG. 3 (Part a) shows the magnetization directions in a state where no magnetic field is detected (neutral position, position P0 on the graph in FIG. 3 (Part d)). FIG. 3 (Part b) shows the magnetization directions in a state where a predetermined positive magnetic field is generated (position P1 on the graph of FIG. 3 (Part d)). FIG. 3 (Part c) shows the magnetization directions in the state where a predetermined negative magnetic field is generated (position P2 on the graph of FIG. 3 (Part d)).

In the state where no magnetic field is detected as in FIG. 3 (Part a) (neutral position P0), the magnetization direction 10A of the pinned magnetic layer 10 and the magnetization direction 30A of the free magnetic layer 30 are stable in a state where they are inclined from each other by an angle of about 90 degrees. This is because each magnetization direction is the direction of the easy magnetization axis. That is, in the tunnel magnetoresistive element 1 shown in FIG. 3, the magnetization easy axis of the free magnetic layer 30 is formed being inclined about 90 degrees from the magnetization easy axis of the pinned magnetic layer 10. An arrow 10A shown in FIG. 3 (Part a) indicates the direction of the magnetization easy axis of the pinned magnetic layer 10, and an arrow 30A indicates the direction of the magnetization easy axis of the free magnetic layer 30.

As shown in FIG. 3 (Part a), (Part b), and (Part c), the magnetization direction 10A of the pinned magnetic layer 10 is not affected by the change of the external magnetic field but constant, and the magnetization direction 30A of the free magnetic layer 30 changes depending on the external magnetic fields (H1 and H2).

As shown in of FIG. 3 (Part b), when an external magnetic field H1 having a direction opposite to the magnetization direction 10A of the pinned magnetic layer 10 is applied to the tunnel magnetoresistive element 1, the magnetization direction 30A of the free magnetic layer 30 turns to a direction opposite to the magnetization direction 10A of the pinned magnetic layer 10, so that resistance of the insulating layer 20 increases due to the tunnel effect (the resistance increases from R0 to R1 in of FIG. 3 (Part d)). The change in resistance is schematically shown by the thickness of the arrows showing the current I0, I1, and I2 in FIG. 3 (Part a), (Part b), and (Part c)).

As shown in FIG. 3 (Part c), when an external magnetic field H2 having a direction equivalent to the magnetization direction 10A of the pinned magnetic layer 10 is applied to the tunnel magnetoresistive element 1, the magnetization direction 30A of the free magnetic layer 30 turns to a direction equivalent to the magnetization direction 10A of the pinned magnetic layer 10, so that resistance of the insulating layer 20 decreases due to the tunnel effect (the resistance decreases from R0 to R2 in FIG. 3 (Part d)).

It is desired to realize a tunnel magnetoresistive element 1 as shown in FIG. 3 (Part d), having such a property (linearity) that the resistance (shown on the vertical axis) changes in proportion to the strength of the external magnetic field (the graph is linear) both in increasing and decreasing of the resistance.

Figure 4:
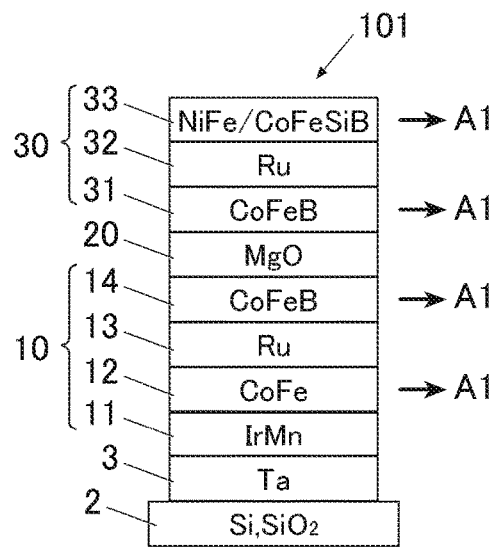
FIG. 4 shows a cross-Partal view showing a stack structure of a conventional tunnel magnetoresistive element.

FIG. 4 shows a tunnel magnetoresistive element 101 of a conventional example described in Patent Documents 3 to 7 having a stack structure where a fixed magnetic layer 10 is formed below the insulating layer 20, a free magnetic layer 30 is formed above the insulating layer 20, and the free magnetic layer 30 includes a ferromagnetic layer (CoFeB) 31, a soft magnetic layer (NiFe or CoFeSiB) 33, and a magnetic coupling layer (Ru) 32 interposed therebetween.

Specifically, the tunnel magnetoresistive element 101 of the conventional example has a stack structure as follows: on a substrate (Si, SiO$_2$) 2 is formed an underlayer (Ta) 3; as a pinned magnetic layer 10 stacked thereon are an antiferromagnetic layer (IrMn) n, a ferromagnetic layer (CoFe) 12, a magnetic coupling layer (Ru) 13, and a ferromagnetic layer (CoFeB) 14 from below; further stacked is an insulating layer (MgO) 20; and as a free magnetic layer 30 stacked thereon are a ferromagnetic layer (CoFeB) 31, a magnetic coupling layer (Ru) 32, and a soft magnetic layer (NiFe or CoFeSiB) 33 from below.

Figure 5:
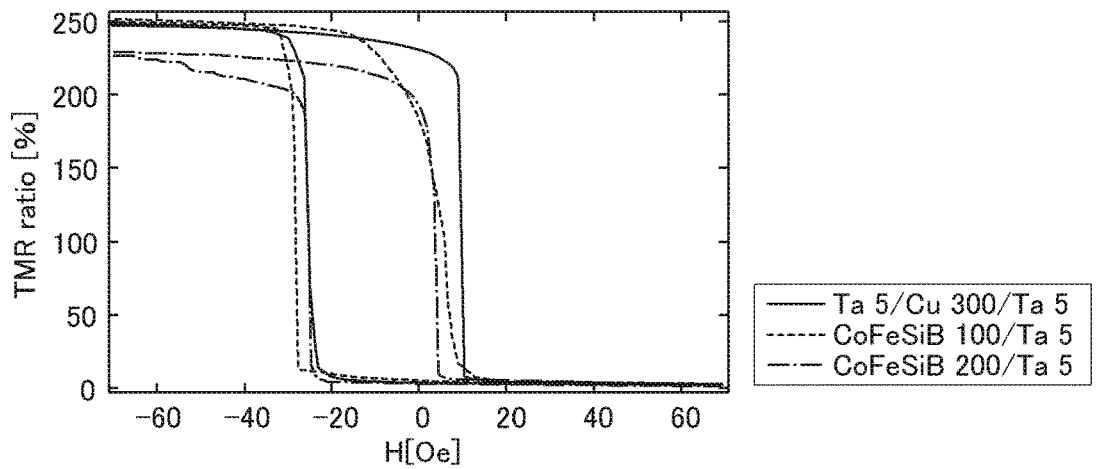
FIG. 5 shows a graph showing magnetoresistance characteristics developed in conventional examples of FIG. 4. The horizontal axis of the graph represents the external magnetic field (H(Oe)), and the vertical axis represents the rate of change in resistance of the tunnel magnetoresistive element (TMR ratio (%)).

In such a conventional tunnel magnetoresistive element 101, the above-described linearity cannot be realized even by heating treatment of twice or more where the applied external magnetic field has different direction each time, because easy magnetization axes of all magnetic layers are in the same direction so that the magnetoresistance characteristics have high hysteresis as in FIG. 5. Arrows A1 in FIG. 4 indicate the direction of the easy magnetization axes of the magnetic layers.

Figure 6:
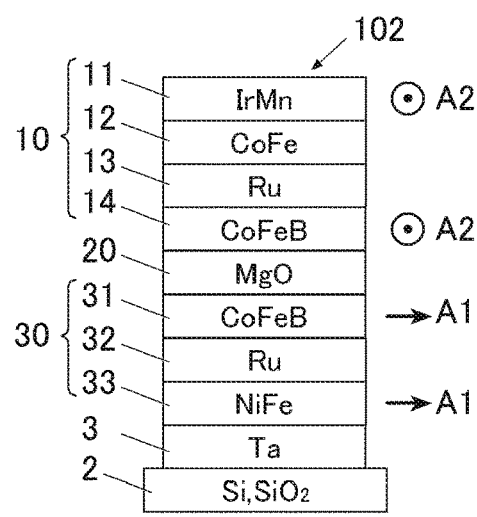
FIG. 6 shows a cross-Partal view showing a stack structure of another conventional tunnel magnetoresistive element.

Meanwhile, FIG. 6 shows a tunnel magnetoresistive element 102 of a conventional example described in Patent Document 8 having a stack structure of FIG. 4, with the exception that the fixed magnetic layer 10 and the free magnetic layer 30 in FIG. 4 are upside down.

This conventional tunnel magnetoresistive element 102 can be formed such that the direction (arrow A1) of the easy magnetization axis of the free magnetic layer 30 is in a direction different from the direction (arrow A2) of the easy magnetization axis of the pinned magnetic layer 10. Furthermore, the free magnetic layer 30 can be formed largely (considered to improve Hk and reduce noise). However, the insulating layer 20 and the pinned magnetic layer 10, which are upper layers, are adversely affected (considered to be caused by deterioration of uniformity and crystallinity). Therefore, it was difficult to improve the performance as a magnetic sensor.

Figure 7:
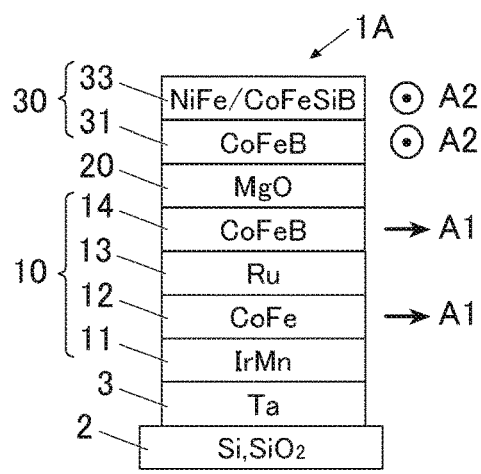
FIG. 7 shows a cross-Partal view showing a stack structure of a tunnel magnetoresistive element according to an embodiment of the present invention.

Therefore, the tunnel magnetoresistive element 1A according to the production method of the present invention shown in FIG. 7 has a stack structure similar to the conventional tunnel magnetoresistive element 101 in that a fixed magnetic layer 10, an insulating layer 20, and a free magnetic layer 30 are stacked in this order from the side close to the substrate 2 which supports the magnetic layers 10 and 30 and the insulating layer 20. However, the magnetic coupling layer (Ru) 32 in the stack structure of the conventional tunnel magnetoresistive element 101 is not included and the free magnetic layer 30 has a stack structure including a ferromagnetic layer 31 whose lower surface is joined to the insulating layer 20, and a soft magnetic layer 33 stacked in contact with the upper surface of the ferromagnetic layer 31.

According to such a stack structure, it is possible to realize the above-described linearity by forming the ferromagnetic layer 31 and the soft magnetic layer 33 constituting the free magnetic layer 30 which have respective easy magnetization axes in the same direction as each other, but in a direction different from the easy magnetization axis of the pinned magnetic layer 10 (in an inclined direction, for example, in a direction inclined by an angle of about 90 degrees).

(Main Point of Producing Process)

Main points of the producing method for that purpose are described.

Figure 8A:
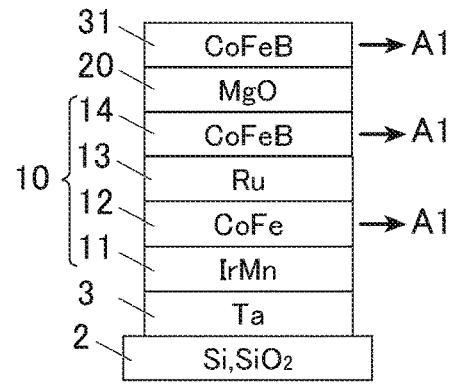
FIG. 8A shows a cross-Partal view of a stack structure showing a production process of a tunnel magnetoresistive element according to an embodiment of the present invention.

First, as shown in FIG. 8A, after stacking layers on the substrate 2 to at least the ferromagnetic layer 31, the above-described B absorption layer (not shown in the drawing) and the cap layer for processing are further stacked. After that, in a first in-magnetic field heating step, this stack is heated while an external magnetic field is applied in a predetermined direction (arrow A1) so that an easy magnetization axis of the ferromagnetic layer 31 as the free magnetic layer and an easy magnetization axis of the pinned magnetic layer 10 are in the same direction.

Figure 8B:
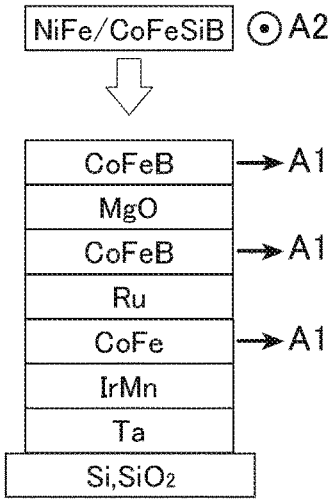
FIG. 8B shows a cross-Partal view of a stack structure showing a production process of the tunnel magnetoresistive element next to the process shown in FIG. 8A, according to the embodiment of the present invention.

After the first in-magnetic field heating step, the B absorption layer and the cap layer for processing are further removed with high accuracy as described above. After that, in an in-magnetic field deposition step, the soft magnetic layer 33 constituting the free magnetic layer 30 is deposited during application of an external magnetic field having a direction (the direction of arrow A2) inclined from or different from the external magnetic field applied in the first in-magnetic field heating step as shown in FIG. 8B, so as to have a magnetization easy axis in a direction different from the magnetization easy axis of the pinned magnetic layer 10 (for example, in a direction inclined by an angle of about 90 degrees). The stack structure shown in FIG. 8C is thereby obtained.

Figure 8C:
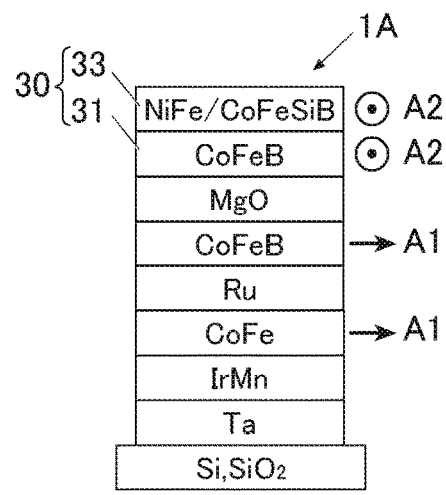
FIG. 8C shows a cross-Partal view of a stack structure showing a production process of the tunnel magnetoresistive element next to the process shown in FIG. 8B, according to the embodiment of the present invention.

According to the magnetization characteristics shown in FIG. 8C after the above first in-magnetic field heating step and the in-magnetic field deposition step, it is possible to form the ferromagnetic layer 31 and the soft magnetic layer 33 that constitute the free magnetic layer 30 having respective easy magnetization axes in the same direction as each other, as well as in a direction different from the easy magnetization axis of the pinned magnetic layer 10 (preferably in a direction inclined by an angle of about 90 degrees). That is, the easy magnetization axis of the pinned magnetic layer 10 is formed in the direction of the magnetic field (arrow A1) applied in the first in-magnetic field heating step, and the easy magnetization axis of the free magnetic layer 30 is formed in the direction of the magnetic field (arrow A2) applied in the in-magnetic field deposition step.

Figure 9:
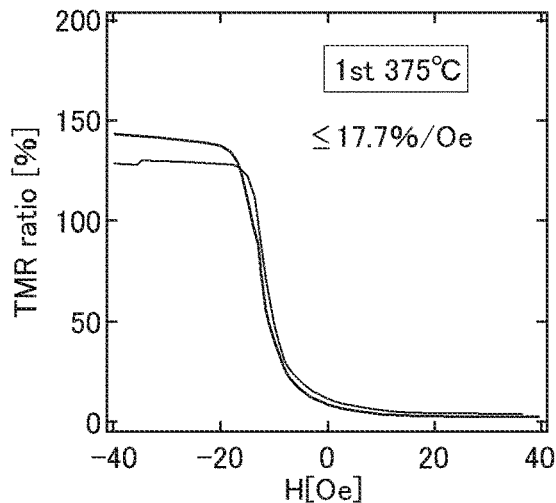
FIG. 9 shows a graph showing magnetoresistance characteristics of a tunnel magnetoresistive element according to an embodiment of the present invention. The horizontal axis of the graph represents the external magnetic field (H(Oe)), and the vertical axis represents the rate of change in resistance of the tunnel magnetoresistive element (TMR ratio (%)).

The magnetoresistive characteristics having linearity as shown in FIG. 9 is now obtained.

Figure 10A:
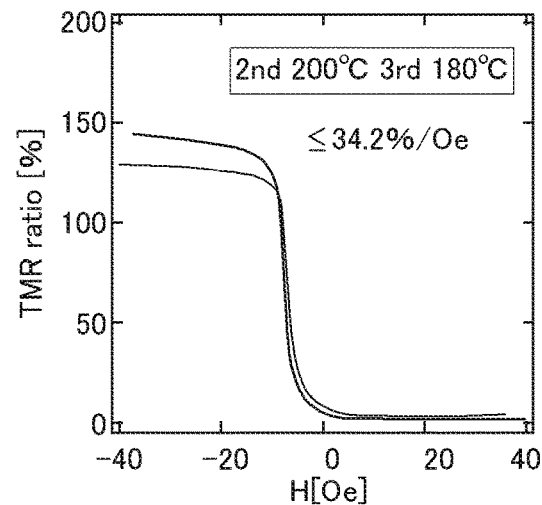
FIG. 10A shows a graph showing magnetoresistance characteristics of a tunnel magnetoresistive element after the second and third in-magnetic field heating steps according to an embodiment of the present invention. The heat treatment temperature in the second in-magnetic field heating step is 200° C., and the heat treatment temperature in the third in-magnetic field heating step is 180° C. The horizontal axis of the graph represents the external magnetic field (H(Oe)), and the vertical axis represents the rate of change in resistance of the tunnel magnetoresistive element (TMR ratio (%)).
Figure 10B:
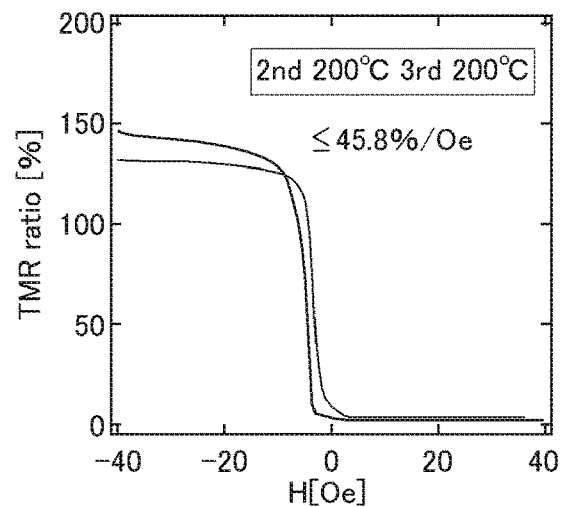
FIG. 10B shows a graph showing magnetoresistance characteristics of a tunnel magnetoresistive element after the second and third in-magnetic field heating steps according to an embodiment of the present invention. The heat treatment temperature in the second in-magnetic field heating step is 200° C., and the heat treatment temperature in the third in-magnetic field heating step is 200° C. The horizontal axis of the graph represents the external magnetic field (H(Oe)), and the vertical axis represents the rate of change in resistance of the tunnel magnetoresistive element (TMR ratio (%)).

Furthermore, the above-described in-magnetic field deposition step is preferably followed by the following steps: a second in-magnetic field heating step in which heating treatment is performed during application of an external magnetic field in the same direction (arrow A2) as in the in-magnetic field deposition step; and a third in-magnetic field heating step after the second in-magnetic field heating step in which heating treatment is performed during application of an external magnetic field in the same direction (arrow A1) as in the first in-magnetic field heating step. As a result, Hk and Hc can be reduced to achieve high sensitivity as shown in FIGS. 10A and 10B.

(Example of Producing Process)

Here, an embodiment of a producing process according to the above-described main points of the producing method will be described with reference to FIG. 11. The underlayer 3 is not shown in FIG. 11.

The first in-magnetic field heating step is performed on a ferromagnetic tunnel junction (MTJ) multilayer (layers 10, 20, and 31) deposited on the substrate 2 (FIG. 11 (Part a)).

The applied magnetic field is in the direction of arrow A1, the strength of the magnetic field is 1 T, and the temperature for the heat treatment is 375° C. As a result of this heat treatment, the tunnel magneto-resistance (TMR) ratio, which is the rate of change in resistance, is greatly improved.

Resist patterning is performed by photolithography or electron beam lithography (in this example, photolithography) (FIG. 11 (Part b1) and (Part b2)) on the surface of the MTJ multilayer after the first in-magnetic field heating step. A layer 41 is the above-described B absorption layer and the cap layer for processing (corresponding to 51 to 53 and 61 in FIG. 2) formed on the ferromagnetic layer 31 and formed before the first in-magnetic field heating step. A resist pattern 42 is formed on the layer 41.

After forming the resist pattern 42, Ar ion milling and etching to the MgO insulating layer 20 are performed on the MTJ multilayer (FIG. 11 (Part b1) and (Part b2)). Since the MTJ multilayer immediately under the resist pattern 42 is not exposed to Ar ion, the multilayer structure remains up to the uppermost layer and forms an MTJ pillar(s) having the shape of the formed resist (FIG. 11 (Part b1) and (Part b2)).

An interlayer insulation layer 43 is formed for electrically insulating the MTJ pillars from the soft magnetic layer 33 and the upper electrode layer formed in a later process and for current flow only at the MTJ pillars (FIG. 11 (Part c1) and (Part c2)). $SiO_2$ or $Al$—$O_x$ can be used as a material of the interlayer insulation layer 43 (in this example, $SiO_2$ is used). A lift-off method or a contact hole formation method can be used as a process of forming the interlayer insulation layer 43 (in this example, the lift-off method). In the lift-off method, an insulating layer of $SiO_2$ and the like is formed on an entire substrate with the resist pattern 42 for forming the MTJ pillars left. Sputtering or low temperature CVD can be used for deposition of the insulating layer (in this example, low temperature CVD is used). After deposition of the insulating layer, the resist 42 is removed by ultrasonic cleaning of the substrate with an organic solvent such as acetone or dimethyl pyrrolidone. At this time, since the insulating layer deposited on the resist 42 is also removed, it is possible to produce a structure with the multilayer exposed only at the top surface of the MTJ pillar. In the contact hole formation method, the resist pattern 42 for forming the MTJ pillars is removed with an organic solvent or the like, and an insulating layer is formed on the entire substrate. After that, a resist pattern having an opening(s) only at a part(s) requiring electrical contact is formed on the MTJ pillar(s). Then, an opening is formed in the insulating layer by reactive etching using a process gas such as $CHF_3$ and $CH_4$. After the resist pattern for the opening for contact is removed using an organic solvent or the like, the multilayer is exposed only at the top surface of the MTJ pillar in the produced structure.

On the substrate where the interlayer insulation layer 43 is formed, a resist pattern 44 is formed by photolithography using a mask for forming the soft magnetic layer 33 and the upper electrode (FIG. 11 (Part d1) and (Part d2)). In the patterning, an opening(s) are at an area(s) where the soft magnetic layer 33 and the upper electrode layer are formed.

As described above, the layer 41 is accurately removed from the substrate on which the resist pattern 44 for forming the soft magnetic layer 33 and the upper electrode by etching using Ar ion milling, so that the upper CoFeB ferromagnetic layer 31 in the MTJ multilayer is exposed (FIG. 11 (Part e1) and (Part e2)). After deposition of the soft magnetic layer 33 on the exposed CoFeB layer 31, soft magnetic characteristics appear in a magnetoresistance curve. In order to prevent inhibition of magnetic coupling between the CoFeB layer 31 and the soft magnetic layer 33 due to oxidation of the surface of the CoFeB layer 31 or the like, it is desirable to perform etching and deposition continuously under vacuum so that the substrate is not exposed to the atmosphere between the Ar ion milling and deposition of the soft magnetic layer 33. A material used as the soft magnetic layer 33 may include an amorphous material such as CoFeSiB or a soft magnetic material such as a NiFe-based alloy (in this example, CoFeSiB is used). By deposition of the soft magnetic layer 33 during application of a magnetic field in the direction of a hard magnetization axis of the MTJ multilayer (in the direction of arrow A2) (FIG. 11 (Part f1) and (Part f2)), the magnetization easy axis of a magnetic multilayer at a lower portion of the MTJ is inclined 90 degrees from the magnetization easy axis of the upper CoFeB layer 31 and the soft magnetic layer 33. As a result, the obtained magnetoresistive curve has linearity indicating linear change in resistance with respect to the magnetic field component in the hard axis direction of the free magnetic layer 30 as shown in FIG. 9.

In this example, the substrate 2 was Si and $SiO_2$, stacked thereon were Ta of 5 nm, Ru of 10 nm, IrMn of 10 nm, CoFe of 2 nm, Ru of 0.85 nm, CoFeB of 3 nm, MgO of 2.7 nm, CoFeB of 3 nm, and the layer 41 of 3 nm as described above, and the first in-magnetic field heating was performed at the magnetic field strength of 1 T and at the temperature of 375° C. After that, the CoFeB layer 31 was exposed, and then a soft magnetic layer (CoFeSiB) 33 of 100 nm in thickness was formed by in-magnetic field sputtering.

After deposition of the soft magnetic layer 33, the upper electrode layer is formed (FIG. n (Part g1) and (Part g2)). As a material for the upper electrode layer, Ta, Al, Cu, Au, or the like or a multilayer thereof (Ta/Al multilayer in this example) can be used. The upper electrode layer prevents oxidation of the soft magnetic layer 33, and is in charge of electrical connection with a power supply circuit, amplifier circuit, and the like when the sensor is in operation.

The resist 44 is removed by ultrasonic cleaning using an organic solvent or the like from the substrate on which the soft magnetic layer 33 and the upper electrode are deposited, so that the soft magnetic layer 33 and the upper electrode layer in portions other than the resist opening are removed (FIG. n (Part g1) and (Part g2)). In this way, the soft magnetic layer 33 and the upper electrode layer can be formed in any shape by photolithography. By performing photolithography twice or more, it is also possible to produce an element including the soft magnetic layer 33 and the upper electrode having different shapes from each other.

In the tunnel magnetoresistive element produced by microfabrication described above, the soft magnetic layer 33 is in an "as-deposited" state, where heating treatment is not performed after production of the element. Therefore, softer magnetic characteristic may appear in the magnetoresistance curve by the in-magnetic field heating of the produced element once again for controlling magnetic anisotropy of the soft magnetic layer. By heating treatment in a rotating magnetic field or by heating treatment while changing the magnetization direction from the hard axis direction to the easy axis direction of the soft magnetic layer 33, it is possible to reduce Hk of the soft magnetic layer and to obtain higher magnetic field sensitivity.

In this example, from the magnetization direction in the first in-magnetic field heating step (direction of arrow A1) was inclined the magnetization direction in the second in-magnetic field heating step (direction of arrow A2) by an angle of 90 degrees, and was not inclined the magnetization direction in the third in-magnetic field heating step (direction of arrow A1). Heating temperature in the second in-magnetic field heating step was 200° C. and heating temperature in the third in-magnetic field heating step was 200° C. The magnetoresistance curve shown in FIG. 10B was thereby obtained. The magnetoresistance curve shown in FIG. 10A was obtained when heating temperature in the second in-magnetic field heating step was 200° C. and heating temperature in the third in-magnetic field heating step was 180° C. Thus, by raising the heating temperature in the third in-magnetic field heating step, it can be seen that both Hk and Hc are reduced to achieve high sensitivity.

As shown in FIG. 7, the method for producing a tunnel magnetoresistive element according to the present invention differs from that of the conventional element in that the soft magnetic layer is sputtered after the first in-magnetic field heating step of the MTJ multilayer. Therefore, the soft magnetic layer does not adversely affect the process of developing a high TMR ratio by the in-magnetic field heating treatment. Therefore, in view of use and convenience, the best material as the soft magnetic layer can be selected from a variety of materials such as ferrimagnetic alloy (for example, permalloy and amorphous), ferromagnetic alloy (for example, ferrite), and microcrystal alloy.

Furthermore, while the thickness of the free magnetic layer is limited to several nm to several hundreds nm according to the conventional tunnel magnetoresistive element, it is possible to join a soft magnetic layer having a very large volume, for example, a thickness of several µm, in the free magnetic layer according to the production method of the present invention. As a result, it is possible to greatly reduce white noise and 1/f noise due to thermal fluctuation of the free magnetic layer and to expect production of a magnetic sensor having a high SN ratio.

Furthermore, the free magnetic layer can be freely shaped since it is located on the outermost surface of the element. Therefore, it is possible to expect production of a tunnel magnetoresistive element including a flux concentrator (FC) for concentrating magnetic flux in the free magnetic layer. The conventional tunnel magnetoresistive element and the FC have been produced as physically separated structures, however, the free magnetic layer and the FC have a structure where thin layers are joined or an integrated structure according to the present invention. Accordingly, it is possible to make the most of the effect of concentrated magnetic flux.

The directly contacting B absorption layer was Ta in the above example, but the present invention is not limited to this. Any material that absorb B can be selected, such as Ta, Ni, Ti, and MgO.

Furthermore, the two or more B absorption layers including layers of different materials in the above example are merely examples. It is possible to select any two or more materials that absorb B, such as Ta, Ni, Ti, and MgO.

INDUSTRIAL APPLICABILITY

The present invention can be used for producing a tunnel magnetoresistive element.

REFERENCE SIGNS LIST

1 Tunnel magnetoresistive element
1A Tunnel magnetoresistive element
2 Substrate
3 Underlayer
10 Pinned magnetic layer
20 Insulating layer
30 Free magnetic layer
31 Ferromagnetic layer
33 Soft magnetic layer
51 Contact B absorption layer
51 to 53 B absorption layer
61 Cap Layer for Processing

The invention claimed is:

1. A method for producing a tunnel magnetoresistive element in which a magnetic tunnel junction is formed with a pinned magnetic layer whose magnetization direction is fixed, a free magnetic layer whose magnetization direction changes depending on an external magnetic field, and an insulating layer disposed between the pinned magnetic layer and the free magnetic layer, and in which resistance of the insulating layer changes by a tunnel effect depending on an angle between the magnetization direction of the pinned magnetic layer and the magnetization direction of the free magnetic layer, the method comprising:
    stacking including:
        stacking the pinned magnetic layer on a substrate, followed by stacking the insulating layer;
        stacking a CoFeB layer in contact with an upper surface of the insulating layer;
        stacking a directly contacting B absorption layer which is in contact with an upper surface of the CoFeB layer and includes a material which absorbs B; and
        stacking two or more layers on the CoFeB layer, the two or more layers including the directly contacting B absorption layer and including layers of different materials;
    in-magnetic field heating including heating treatment of a stack after the stacking while applying an external magnetic field of a predetermined direction so that an easy magnetization axis of the CoFeB layer constituting the free magnetic layer is formed in a same direction as an easy magnetization axis of the pinned magnetic layer; and
    dry etching including removal of layers to the directly contacting B absorption layer from the stack after the in-magnetic field heating,
    wherein, in the dry etching, a dry etching apparatus and an analyzer which identifies a material at a surface etched by the dry etching apparatus are used, the dry etching apparatus ends etching at endpoint detection time when the analyzer detects that a last layer which appears before exposure of the directly contacting B absorption layer decreases to a predetermined level or that the directly contacting B absorption layer increases to a predetermined level, and
    wherein, in the stacking, the directly contacting B absorption layer is stacked such that a thickness from the predetermined level to the upper surface of the CoFeB layer corresponds to an over-etching amount by the dry etching apparatus after the endpoint detection time detected by the analyzer determined in advance.

2. The method according to claim 1, wherein the two or more layers on the CoFeB layer stacked in the stacking include at least one B absorption layer and a cap layer for processing, the at least one B absorption layer including a material which absorbs B, and the cap layer for processing covering the at least one B absorption layer.

3. The method according to claim 2, wherein the at least one B absorption layer stacked in the stacking includes the directly contacting B absorption layer and includes layers of different materials.

4. The method according to claim 3, wherein, in the in-magnetic field heating, a desired TMR ratio is achieved through absorption of B from the CoFeB layer by the at least one B absorption layer.

5. The method according to claim 1, further comprising depositing a soft magnetic layer on the CoFeB layer which is exposed in the dry etching.

* * * * *